(12) United States Patent
Hurni

(10) Patent No.: US 10,468,553 B1
(45) Date of Patent: Nov. 5, 2019

(54) CONTACT FOR SEMICONDUCTOR DEVICE

(71) Applicant: SORAA, INC., Fremont, CA (US)

(72) Inventor: Christophe A. Hurni, Fremont, CA (US)

(73) Assignee: SORAA, INC., Fremont, CA (US)

( * ) Notice: Subject to any disclaimer, the term of this patent is extended or adjusted under 35 U.S.C. 154(b) by 0 days.

(21) Appl. No.: 14/975,467

(22) Filed: Dec. 18, 2015

Related U.S. Application Data

(60) Provisional application No. 62/093,855, filed on Dec. 18, 2014.

(51) Int. Cl.
*H01L 33/32* (2010.01)
*H01L 33/00* (2010.01)
*H01L 33/40* (2010.01)
*H01L 33/62* (2010.01)

(52) U.S. Cl.
CPC .......... *H01L 33/32* (2013.01); *H01L 33/0075* (2013.01); *H01L 33/405* (2013.01); *H01L 33/62* (2013.01)

(58) Field of Classification Search
CPC .............................. H01L 33/405; H01L 33/32
See application file for complete search history.

(56) References Cited

U.S. PATENT DOCUMENTS

| 6,573,537 | B1 | 6/2003 | Steigerwald et al. |
| 2006/0281238 | A1* | 12/2006 | Harris ................. H01L 29/7783 438/172 |
| 2009/0294784 | A1* | 12/2009 | Nakahara ................. H01L 33/20 257/98 |
| 2011/0115084 | A1 | 5/2011 | Ueshima et al. |
| 2011/0136273 | A1 | 6/2011 | Choy et al. |
| 2011/0220934 | A1 | 9/2011 | Gotoda et al. |
| 2011/0298021 | A1* | 12/2011 | Tada ................. H01L 21/02126 257/288 |
| 2012/0313092 | A1* | 12/2012 | Shieh ................... H01L 21/428 257/43 |
| 2013/0056776 | A1 | 3/2013 | Su et al. |

FOREIGN PATENT DOCUMENTS

CN    103178181 A    6/2013

OTHER PUBLICATIONS

European Search Report dated Jun. 30, 2017 in Application No. EP 17 16 5385.

* cited by examiner

*Primary Examiner* — Matthew C Landau
*Assistant Examiner* — Mark Hatzilambrou
(74) *Attorney, Agent, or Firm* — FisherBroyles LLP

(57) ABSTRACT

A semiconductor comprising at least one contact, formed on an interface with the semiconductor, the contact comprising at least a layer of a first metal, the first metal being of sufficient amount to impart a first property in the layer; and a second metal diffused in the layer, the second metal having a concentration in the layer sufficiently low such that the second metal does not diminish significantly the first property of the layer, the concentration being sufficiently high such that the second metal imparts significantly a second property in the layer.

21 Claims, 18 Drawing Sheets

Step 1B: Diffusion

Step 1A: Deposition of Contact Stack

Step 1B: Diffusion

Step 1: Mesa etch.

Step 2: AgTiAg deposition and annealing in an oxygen-free environment

Step 3: Deposition of Ti layer to protect for further process steps

Step 4: Deposition of p-contact and possible annealing steps. The Ti ILayer may be removed

US 10,468,553 B1

CONTACT FOR SEMICONDUCTOR DEVICE

RELATED APPLICATION

This application claims priority to U.S. Provisional Application No. 62/093,855, filed Dec. 18, 2014, hereby incorporated by reference.

FIELD OF INVENTION

The subject matter herein relates generally to a contact for a semiconductor device, and, more particularly, to a semiconductor contact having diffused secondary elements for enhanced performance.

BACKGROUND

In the design of semiconductor contacts, the performance properties of the contacts typically involve compromise. For example, because of work function alignment with the semiconductor, some materials may be preferred for electrical contacts, but these materials may not be desirable as the main material in contact with the semiconductor because their thermal conductivity, adhesion, reflectivity, etc., may not be as good as other materials. For example, in the context of visible-spectrum light emitting diodes (LEDs), silver (Ag) is the most desirable metal because of its high reflectivity. However, using conventional techniques, Ag is a mediocre electrical contact for both the n-doped and p-doped regions. On the other hand, metals such as platinum (Pt), palladium (Pd), and nickel (Ni) for the p-doped region of GaN and aluminum (Al) and titanium (Ti) for the n-doped region of GaN tend to make excellent electrical contacts due to work function alignment. However, these metals are optically absorbing, which leads to a loss of efficacy of the LED.

Therefore, there is a need for a contact has can optimize different and even competing properties of metals. The present invention fulfills this need among others.

SUMMARY OF INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

Applicants recognize that the use of one or more metals diffused in the metal of a contact layer can enhance the properties of the contact layer. Specifically, the main first metal of the contact is a material, which generally is present in bulk to impart its bulk or interfacial property to the contact, while the second, diffused metal need only be present in small or trace amounts to impart its interfacial property to the contact. To this end, Applicants have discovered surprisingly that diffusing the second metal in a layer of the first metal imparts the interfacial property of the second metal to the layer, yet does not diminish the first metal's bulk or interfacial properties in the layer.

One aspect of the invention is a semiconductor having a contact comprising one metal diffused in the other. In one embodiment, the semiconductor comprises at least one contact, said contact comprising at least: (a) a layer of a first metal, said first metal being of sufficient amount (expressed, for example, by volume, thickness, or atomic concentration), to impart a first property in said layer; and (b) a second metal diffused in said layer, said second metal having a concentration in said layer sufficiently low such that said second metal does not diminish significantly said first property of said layer, said concentration being sufficiently high such that said second metal imparts significantly a second property in said layer.

Another aspect of the invention is method of preparing a contact in a semiconductor by diffusing one metal in another. In one embodiment, said method comprises: (a) disposing a layer of a first metal in sufficient amount (expressed, for example, by volume, thickness, or atomic concentration) to impart a first property in said layer; and (b) diffusing a second metal in said layer, said second metal having a second physical property and a concentration in said layer, said concentration being sufficiently low that said second metal does not diminish significantly said first physical property of said layer, said concentration being sufficiently high that said second metal imparts significantly said second property in said layer.

The present invention therefore provides for a number of important benefits. For example, with respect to LED devices, the invention provides more freedom in the optimization of the LED design for white wall plug efficiency by facilitating high-reflectivity and low-resistivity in both the n- and p-contact. Prior to this disclosure, design optimization usually had to consider the total forward voltage, which is a function of contact areas, contact resistances and LED forward voltage, LED efficiency droop and the reflectivity of both contacts. That means that a design with optimized droop and optimized total forward voltage may not have the highest white wall plug efficiency because it requires a large n-contact which, prior to this disclosure, would have absorbed too much light for this design to be considered. However, with the availability of a high-reflectivity and low-resistivity for the n-contact as described herein, the optimization of white wall plug efficiency is made easier and only the optimization of droop and forward voltage has to be considered. Still other benefits and advantages of the present invention will be known to those of skill in the art in light of this disclosure.

BRIEF DESCRIPTION OF DRAWINGS

The drawings, described below, are for illustration purposes only. The drawings are not intended to limit the scope of the present disclosure.

DETAILED DESCRIPTION

Figure 7:
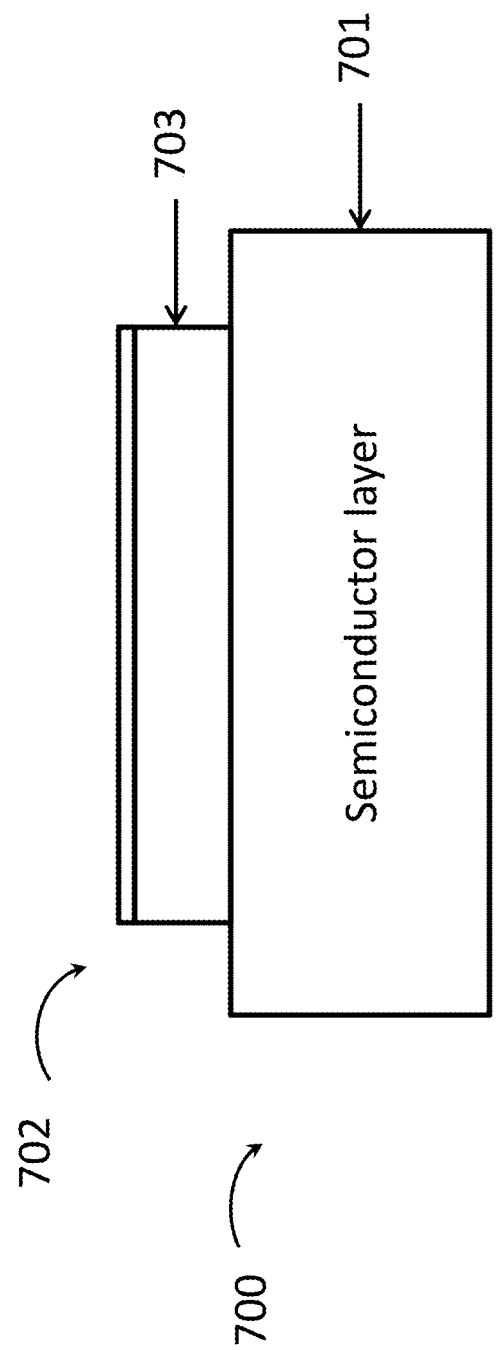
FIG. 7 is a schematic of one embodiment of a semiconductor of the present invention.

Referring to FIG. 7, a semiconductor device 700 of the present invention is shown. The semiconductor device comprises at least one semiconductor layer 701 and one contact 702 comprising at least a layer 703 of a first metal. The contact is in contact with the semiconductor layer. The first material is present in sufficient amount to impart a first property in the layer. The contact 702 also comprises a second metal diffused in the layer. The second metal has a concentration in the layer 703, which is sufficiently low such that the second metal does not diminish significantly the first property of the layer. Yet the concentration is sufficiently high that the second metal imparts significantly a second property in the layer. These elements and selected embodiments are described in greater detail below.

It should be understood that this invention may be applied to any semiconductor-based device having contacts. Examples of suitable semiconductor-based devices include, for example, light emitting diodes (LEDs), super luminescent diode (SLD); diode lasers (e.g., vertical cavity surface emitting laser (VCSEL), double channel, planar buried heterostructure (DC-PBH), buried crescent (BC), distributed feedback (DFB), distributed bragg reflector (DBR); photodiodes (e.g., P Intrinsic N (PIN) and avalanche photodiode (APD); photonic processors (e.g., CMOS photonic processor, electro-optical memory, electro-optical random-access memory (EO-RAM) or electro-optical dynamic random-access memory (EO-DRAM), and electro-optical logic chips for managing optical memory (EO-logic chips); and photogalvanic cells. Additionally, the invention applies to non-light emitting semiconductors such as switches/transistors (e.g., .bipolar junction transistor (BJT) and field-effect transistor (FET). It should be understood that the semiconductor device may be a single discrete device or it may be assembled or integrated as an array of devices. It should also be understood that the invention is applicable to alternative and later —developed devices not listed above. In one embodiment, the semiconductor device is an LED.

In one embodiment, the semiconductor device comprises an active region 701. As used herein, active region means a set of light-emitting layers. Active regions are well known in the art and, accordingly, they will not be described in detail herein. One of skill in the art will ready understand how to configure a suitable active region for any of the semiconductor devices described above. In an embodiment, having an active region, the contact is electrically connected to the active region 701. It should be understood that not all semiconductor devices have active regions.

Of particular interest herein is the contact 702 of the semiconductor device. As is known, in a typical configuration the semiconductor comprises two contacts, a p contact and an n contact. Again, the general configuration of such contactor layers is well-known and will not be addressed in detail herein. In the present invention, however, the contact 702 is configured to provide enhanced properties by imparting the beneficial properties of two or more metals in a common layer as described in detail below. The invention disclosed herein may be applied to either contact or two both.

As mentioned above, an important aspect of the present invention is the first and second metals and the properties they impart to the contact. The first metal is a material that generally needs to be present in bulk to impart its property to the contact, while the second metal need only be present in small or trace amounts to impart its interfacial property to the contact. To this end, Applicants have discovered surprisingly that diffusing the second metal in a layer of the first metal imparts the desirable property in the layer, yet does not diminish the first metal's properties in the layer.

One of skill in the art will understand that diffusing means causing a first species to become spatially distributed within a second species by movement of the first species within the second species. Thus, a metal that is diffused in another metal may be characterized by a spatially distribution of a certain concentration in the other metal. For instance, the spatial distribution of a metal in a metal stack may be measured before and after diffusing. Before diffusing, the concentration of the metal is relatively localized. After diffusing, the metal is relatively dispersed (i.e., less localized) (e.g. its peak concentration may decrease and the width of its distribution may increase). Diffusing may be achieved using a variety of known techniques—e.g., by submitting a structure containing two or more species to a given temperature (or a variety of temperature steps) for a controlled time or by introducing the diffuse species at an interface for a sufficient time (for instance, placing the structure in a solution containing the species to be diffused). In some embodiments, the diffusion step may be combined with a deposition step (for instance, the metal to be diffused may be deposited at a high temperature, such that it diffuses upon deposition). Diffusion is a well-known concept and alternative diffusion approaches will be known by those of skill in the art in light of this disclosure.

In some embodiments the diffused species reaches a diffusion barrier (for instance, a semiconductor interface or a metal diffusion barrier). In such embodiments, an accumulation of the diffused species at the interface may be observed.

Generally, although not necessarily, the first and second metals are selected for complementary properties. For example, in a photonic semiconductor, the first and second properties may relate to optical properties (such as reflectivity) and electrical properties (such as work function alignment, contact resistance), respectively. Although this disclosure anticipates any range of properties for the first and second metals, in one embodiment, the first metal's property relates to one of the following: optical properties (such as reflectivity), mechanical properties (such as adhesion), thermal properties (such as thermal conductivity), electrical properties (such as conductivity, work function alignment); and the second metal's property relates to one of the following: mechanical properties (such as adhesion), electrical properties (such as conductivity, work function alignment). In some embodiments, the first metal's properties are either its bulk properties or its interfacial properties, while the second metal's properties are mainly its interfacial properties. One of skill in the art will understand that bulk properties refer to properties of a material considered per se, while interfacial properties refer to properties of two materials forming an interface. Still other desirable properties will be known to those of skill in the art.

Unexpectedly, Applicants have found that it was indeed possible to have the second metal impart a desirable property to the metal/semiconductor interface, upon its diffusion. In one embodiment, this desirable effect relies on several requirements; for example, the second metal should possess a desirable interfacial property with the semiconductor; and the second metal should be able to diffuse to the semiconductor interface.

For instance, taking the example of an LED device, desirable properties are high reflectivity and low contact resistance. High reflectivity can be obtained by suitably choosing the first metal. Applicants have found that a suitable choice for the second metal was that of a metal having a work function well aligned with the semiconductor (within 0.2 eV, 1 eV, 2 eV, depending on the embodiment) and being able to diffuse. It is hard to predict the ability to diffuse based on phase diagrams or classical diffusion equations; therefore Applicants have found that some metals unexpectedly fulfilled this diffusion property. As an example, Applicants have found that Ti diffused in a bulk Ag layer and was therefore able to create a low-resistance, high reflectivity contact to n-GaN, upon heat treatment at a temperature above 400 C.

The selection of suitable first and second metals to impart the desired properties can be obtained from a few design rules, as already mentioned. For instance, for optical properties, one may seek a metal having a high reflectivity at the wavelengths of interest. For example, a metal selected for its optical properties may be Ag or Al in the visible range, Al in the UV range, and gold in the IR range. Those of skill in the art will readily be able to identify suitable metals to impart the desired reflectivity. In some embodiments, including the examples just recited, the reflectivity is higher than 80% (or 90%, or 95%) at a given wavelength.

For electrical properties, one may seek a metal having a work function which is close to the work function of the semiconductor to be contacted. In some embodiments, the two work functions are within 4 eVs (or 1 eV, 0.5 eV, less than 0.1 eV) of each other. For example, suitable metals for an n-doped GaN layer may include Al or Ti, and for a p-doped GaN layer may include Ni, Pt, and Pd. In other embodiment, the fermi level of the semiconductor interface may be pinned (for instance by doping or an impurity). For example, it may be desirable to heavily dope a p-GaN layer to obtain such a pinning, which relaxes the constraints on work function matching. Further, one preferably seeks a metal capable of diffusing in the first metal.

For mechanical properties, one may seek to optimize the strain in the layer to achieve a property such as adhesion behavior.

The first and second metals are selected for their respective properties and for their relative concentrations. Specifically, as mentioned above, the first metal is one which typically is needed in relatively high amount (or "bulk" amount) to impart its bulk or interfacial property to the contact. The amount may be expressed, for example, in volume, thickness, atomic concentration, or any other known quantification for matter. This generally means that the first metal is provided as a layer of a minimum thickness. The thickness of the layer will vary based on the application and the selection of the first metal. For optical properties, it has been found that layers of at least about 50 nm or about 100 nm have yielded adequate results (typically, this thickness has to be similar to or larger than the skin depth of the metal at the wavelength of interest).

One the other hand, the second metal is one which typically is needed in relatively small concentrations to impart its interfacial property to the layer. Thus, sufficient concentrations may be achieved through diffusion of the second metal in the first metal. Although the concentration of the second metal in the layer will vary based on the application and the selection of the first and second metals, it is generally desirable that the concentration of the second metal in the layer is just enough to impart the second property in the layer, but not to much as to diminish significantly the first property in the layer. Those of skill in the art will be able to determine this concentration without undue experimentation.

In some embodiments, the concentration of the second metal may be expressed as the averaged ratio of the deposited volume of the second metal to the deposited volume of the first metal. In some experiments, it has been found that a ratio of 1/100 gives an adequate result in the embodiment where the first metal is Ag and the second metal is Ni or Ti. In other embodiments, a larger (1/10) or a smaller (1/1000) ratio is acceptable. In some embodiments, such a concentration is limited to a low value by the available deposition method (for instance, it may be difficult to deposit less than 1 angstrom of the second metal).

In other embodiments, the concentration of the second metal is measured by its atomic concentration at the interface with the semiconductor, which may be measured by techniques such as spatially-resolved chemical composition analysis technique (such as SIMS, atom probe, RBS, Auger, XPS, etc.) and expressed in atoms/cm3. In some experiments, it has been found that when the first metal is Ag at an interface with GaN, a peak interfacial concentration of Ni of about 5E19/cm3 gives an adequate result; and a peak interfacial concentration of Ti of about 5E18/cm3 gives an adequate result. More generally, it is expected that concentrations of 1E16/cm3, 1E17/cm3, 1E18/cm3, 1E19/cm3, 5E20/cm3 provide adequate results in embodiments.

Yet another way to express the concetration of the second metal is its relative atomic concentration, with respect to that of the first metal, at the semiconductor interface. The atomic concentration of the first metal, i.e. a bulk metal, is on the order of 1E22-1E23/cm3. Thus the relative atomic concentration of the second metal to the first metal, at the semiconductor interface, may be in the range 1E-7 to 5E-2 to obtain suitable results.

As stated above, the concentration of the second metal in the layer is low enough such that it does not diminish significantly the first property in the layer, meaning that that the first property is not reduced in the layer to the point of detrimentally affecting the application, which can be determined by one of skill in the art in light of this disclosure. In one embodiment, the first property is its reflectivity at a wavelength of interest. The concentration of the second metal is low enough such that the second metal does not reduce reflectivity of the layer by more than 10% in one embodiment, by more than 5% in a more particular embodiment, and by more than 1% in yet a more particular embodiment. For example, if the semiconductor-based device is an LED, and the first metal is silver having a reflectance of 95% at a wavelength of interest then, in one embodiment, the concentration of the second metal (e.g. nickel, titanium, etc) is low enough such that the layer has a reflectance of no less than 90%, and, in a more particular embodiment, the layer has a reflectance of no less than 94%. With respect to relative concentrations of the second metal to the first metal, as discussed above, it can be expected that a relative concentration of less than 1% will impact reflectivity by less than 1%.

As stated above, the concentration of the second metal in the layer is high enough that it imparts significantly the second metal's property (i.e., the second property) to the layer, meaning that that the second property of the layer meets the requirements of the application, which can be determined by one of skill in the art in light of this disclosure. This may be evaluated by a figure of merit for the final device. For instance, in the embodiment of a second metal introduced to improve an electrical contact, the figure of merit may be the contact resistance to the semiconductor. In one example, the contact of the first metal to the semiconductor (in absence of the second metal) is non-ohmic or has a high contact resistance above 1E-1 Ohm·cm2. In the presence of the diffused second metal, the contact is ohmic and has a contact resistance lower than 1E-3 Ohm·cm2, or 1E-4 Ohm·cm2 (as is known in LEDs) or 1E-5 Ohm·cm2 or 1E-6 Ohm·cm2 and lower (as is known in transistors).

In some embodiments, the second property of the layer is obtained by further having the second metal react with an additional chemical species. For instance, it is known that oxidized nickel (e.g. nickel oxide) forms a good electrical contact to p-GaN. Therefore, in some embodiments, the diffusion of the second metal may be combined with an oxidation step (or another step which combines the second metal with another chemical species).

The choice of the first and second metals (and additional diffused metals if desired), and their concentrations will be understood by those of skill in the art in light of this disclosure. Nevertheless for illustrative purposes, below are listed common first and second metals, their properties and amounts/concentrations.

| First Metal | First Property | Layer thickness |
|---|---|---|
| Ag | reflectivity >90% (visible range) | 100 nm |
| Al | reflectivity >80% (visible range) high reflectivity (UV range) | 50 nm |
| Au | High thermal conductivity | 100 nm |
| Au | High reflectivity (infra-red) | 100 nm |

| Second Metal | Second Property | Concentration in Layer |
|---|---|---|
| Ti, Al | low contact resistance to n-GaN work function close to n-GaN (within 0.5eV) | 1e18-1e20cm-3 at semiconductor interface |
| Pt, Ni, Pd, Ru, Rh, NiOx | low contact resistance to p-GaN work function close to p-GaN (within 2eVs) | 1e18-1e20cm-3 at semiconductor interface |

The above first and second metals list above may be mixed and matched in any order according to the application. Additionally, it should be understood that a plurality of second metals may be diffused in the layer to impart a plurality of different properties to the layer.

It should also be understood that the list above is for illustrative purposes and modified or alternative first and second metals, thickness and concentrations may be better suited for different application. Likewise, it should also be understood that one of skill in the art in light of this disclosure will know how to modify these thicknesses and concentrations to optimize the properties of the layer.

Figure 1A:
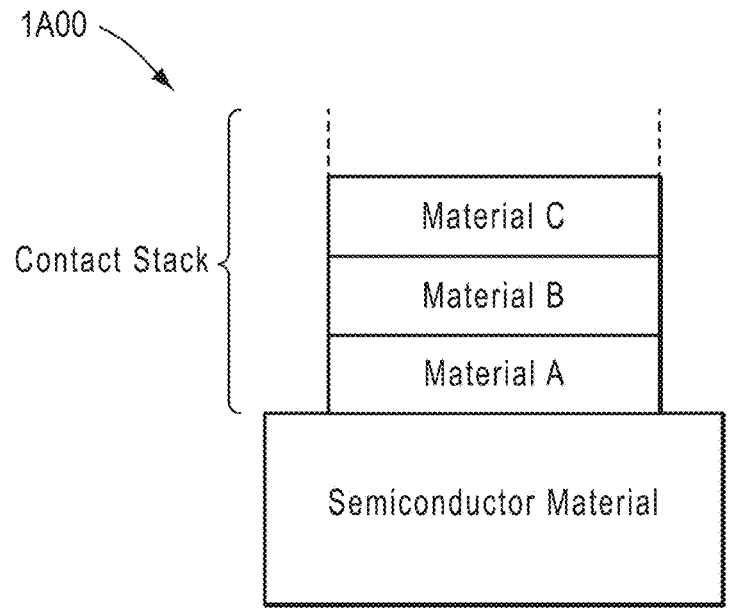
FIG. 1A shows a non-diffused contact stack made of multiple layers, according to some embodiments.
Figure 1B:
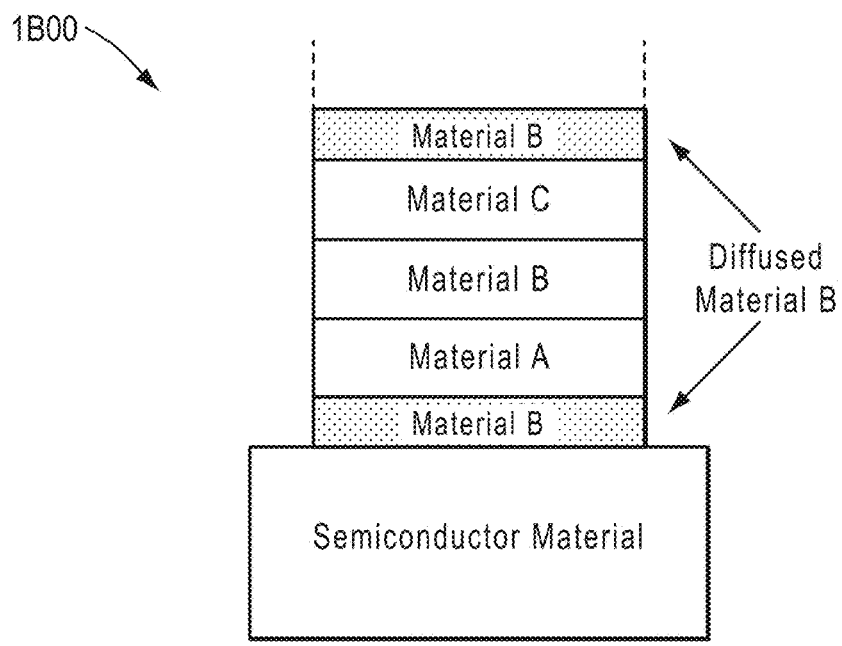
FIG. 1B shows a diffused contact stack made of multiple layers, according to some embodiments.

FIG. 1A presents a non-diffused contact layer for comparison to the diffused contact layer of FIG. 1B.

Specifically, in FIG. 1A, a non-diffused contact stack 1A00 is shown, where material A exhibits certain advantageous properties, such as a high reflectivity, and material B exhibits certain advantageous properties, such as a good electrical contact to the semiconductor material (as suggested by material B's work function). With respect to the aforementioned, metal A corresponds to the first metal, and metal B corresponds to the second metal. It should be understood that in some embodiments, the layer of B is very thin—e.g., thicknesses of no greater than about 10 nm are generally desired.

FIG. 1B shows the same stack after diffusion; metal B is now also present at the semiconductor interface, where it may accumulate upon diffusion. Materials A and B are selected such that diffusion of B in A is possible, for example, during a heat treatment step or an annealing step. The thicknesses of the different layers as well as the diffusion process (heat treatment) must be well controlled so that material B diffuses just enough so as to exhibit its advantageous properties, such as a good electrical contact, but not too much so as to not detract from the advantageous properties of A (such as reflectivity.) Unlike in the conventional embodiment of a material stack where a small amount of B is deposited onto the surface and then capped by A (i.e., where it is difficult to get thicknesses below a few Angstroms) here, in the present disclosure, the amount of B that reaches the surface of the semiconductor can be small and is governed by diffusion. The amount of material B may therefore be characterized by an effective thickness (i.e. the characteristic thickness near the interface where material B has accumulated) Effective thicknesses on the order of a few Angstroms or less can be achieved. It should also be noted that if another element is essential for B to make a good contact to the semiconductor, it can be added, for example, in the atmosphere of the heat treatment (for instance, presence of oxygen during an annealing step). The opposite is also true: if one element is detrimental to one of the layers of the contact stack and/or the contact of B to the semiconductor cannot be formed under certain specific atmospheric conditions, special considerations have to be taken in the diffusion step(s) so as to remove elements that induce or contribute to the detrimental phenomena (for instance, absence of oxygen during an annealing step).

Figure 1C:
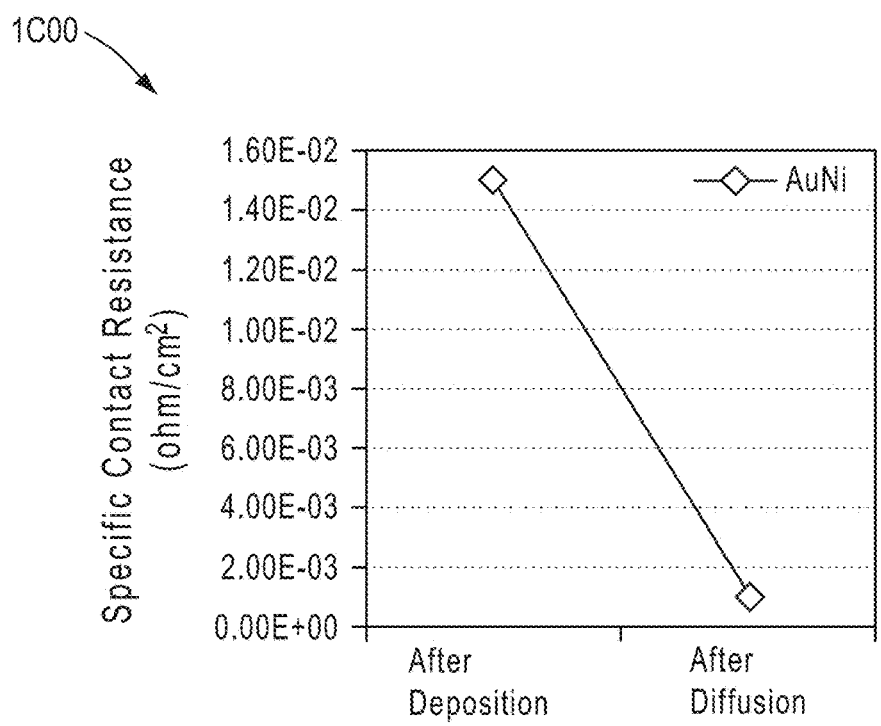
FIG. 1C shows the contact resistance of a metal stack after deposition and after diffusion, according to one embodiment.

FIG. 1C shows the specific contact resistance before and after diffusion for p-GaN with an overlying stack of Au—Ni. In this embodiment, metal A is Au and metal B is Ni. As deposited, the Au layer is about 100 nm thick, and the Ni layer is about 10 nm thick. Following deposition, the Ni is diffused in the Au by a high-temperature diffusion step. The Ni requires a certain minimum amount of oxygen for forming a good electrical contact and hence oxygen was present during the annealing atmosphere (although it is likely that in this specific embodiment, oxygen is present at the surface of the Ni and therefore serves as its own source of oxygen during the diffusion).

Figure 1D:
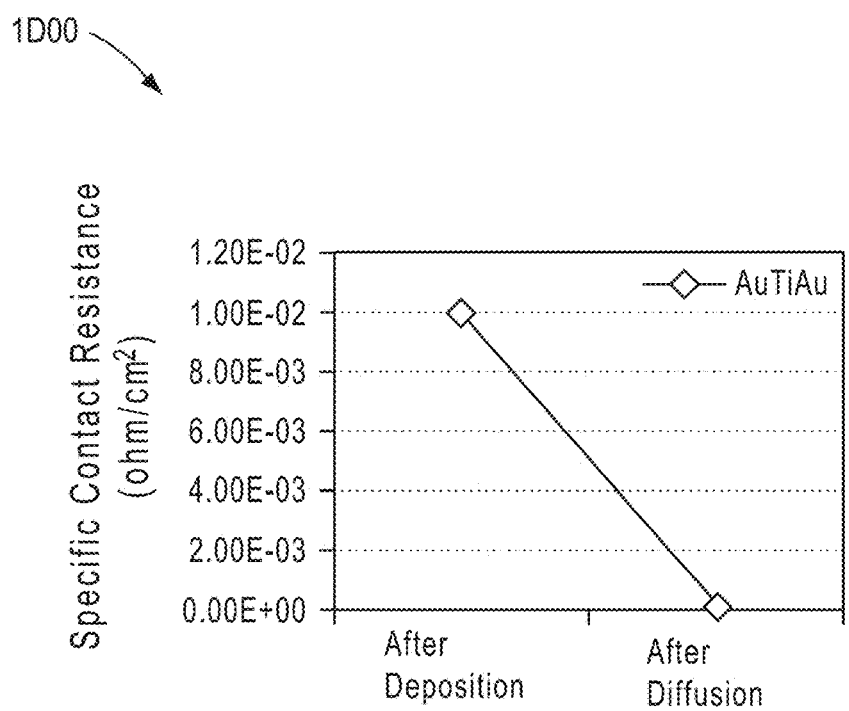
FIG. 1D shows the contact resistance of an alternate metal stack after deposition and after diffusion, according to some embodiments.

FIG. 1D shows the specific contact resistance before and after diffusion for n-GaN with an overlying stack of Au—Ti—Au. In this embodiment, metal A is Au and metal B is Ti. As deposited, the Au layers are about 100 nm thick, and the Ti layer is about 10 nm thick. Here, in contrast to the situation of FIG. 1C, oxygen is removed from the annealing atmosphere because Ti has a tendency to oxidize and become an insulator. This is why, referring again to FIG. 1B, and specifically in the embodiment of the Au—Ti—Au stack, the Ti layer is capped with Au. The Au cap prevents oxidation during the transfer from the evaporation apparatus to the diffusion furnace.

The invention also relates to a method of preparing the contact described above. In one embodiment, the method comprises: (a) disposing a layer of a first metal in sufficient amount to impart a first property in the layer; and (b) diffusing a second metal in the layer, the second metal having a second property and a concentration in the layer, the concentration being sufficiently low that the second metal does not diminish significantly the first property of the layer, the concentration being sufficiently high that the second metal imparts significantly the second property in the layer.

As mentioned above, the preparation of semiconductors is well known and will not be considered in detail herein. Of particular interest, however, is the diffusion of the second metal into the layer of the first metal. This diffusion can be effected in a verity of ways. For example, in one embodiment, a very thin layer of the second metal is overlayed on the layer of the first metal and then the layers are annealed such that the second metal diffuses throughout the layer. Alternatively, the second metal may be introduced with a graded profile simultaneously with the deposition of the first metal, and consequently diffused. In other embodiments, an electrical potential is applied across the structure to induce migration of the second metal. In other embodiments, the semiconductor with the first metal is introduced in a chemical solution containing the second metal, and diffusion occurs from the solution into the first metal. In yet other embodiments, the deposition/diffusion step is replaced with an ion implantation step which introduces the second metal with a desired profile.

Figure 8A:
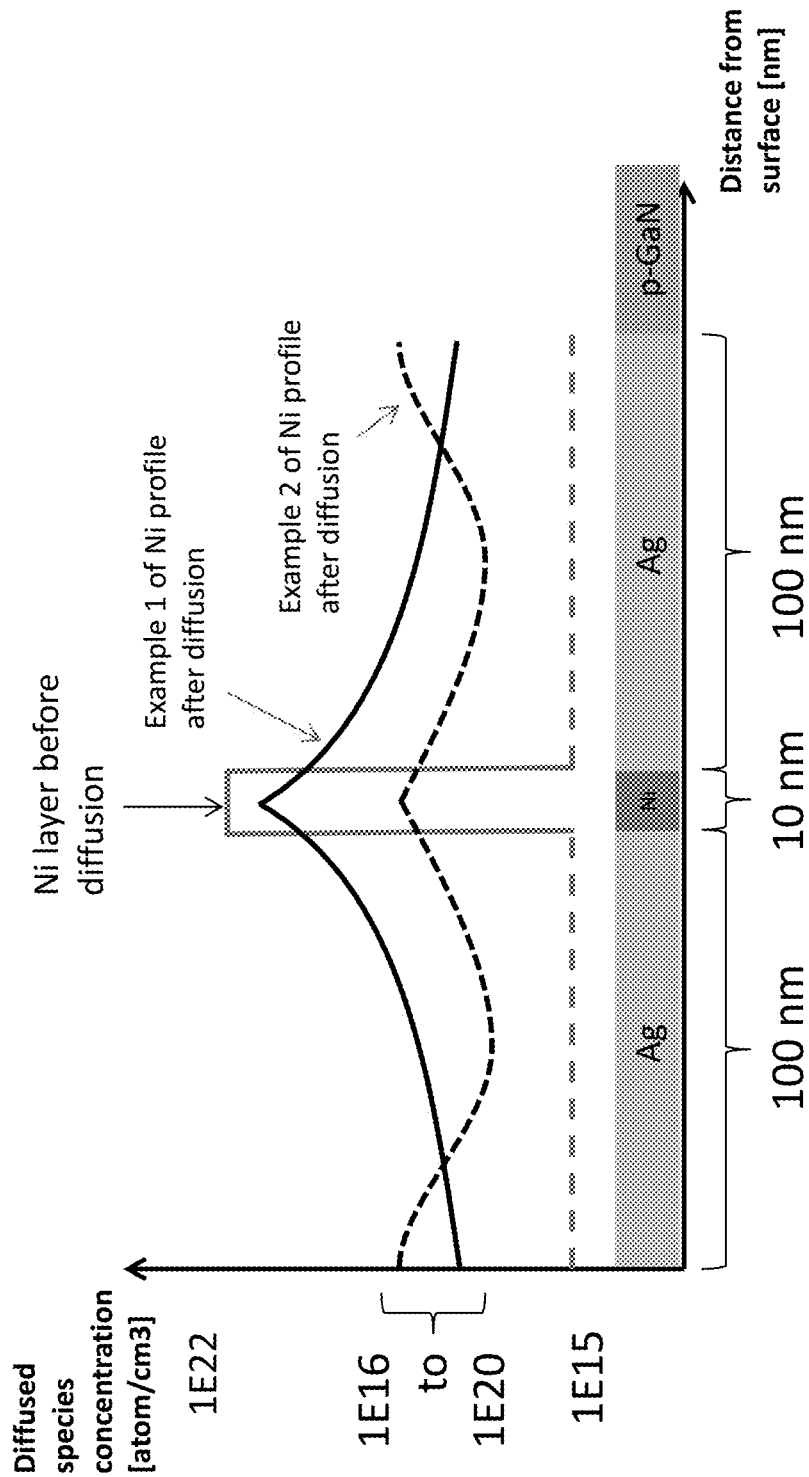
FIG. 8A shows a schematic plot of atomic concentrations of a second metal in a matrix of a first metal as-deposited and diffusion (whose magnitude can be controlled by temperature and/or time).

FIG. 8A shows a schematic plot of atomic concentrations of a second metal in a matrix of a first metal as-deposited and diffusion (whose magnitude can be controlled by temperature and/or time). FIG. 8A shows how the diffusion process enables one to control the interfacial atomic concentration of the second metal. In the example of FIG. 8A, the first metal is Ag and the second metal is Ni.

After deposition, the Ni layer is 10 nm thick and is sandwiched between two 100 nm-thick layers of Ag. One of the Ag layers is deposited on p-GaN. FIG. 8A shows the profile of the initial atomic concentration of Ni, after deposition and before diffusion. The amount of Ni in the Ag layers is very low: it is either present in trace amounts (possibly due to contamination during Ag deposition), or the value is so low that it cannot be accurately quantified (fir instance, using SIMS, the detection limit may be below 1E15 cm-3). This very low value is symbolized by the dashed lines in the initial Ni profile. After diffusion (which may be obtained by a high-temperature step) the Ni profile spreads on either side. Depending on the physics of the diffusion (standard concentration-driven diffusion, or diffusion also driven by other defects such as grains, strain etc.) a variety of diffusion profiles might be expected. Two such profiles, for illustration, are shown on FIG. 8A. The key result is the increase of the atomic concentration of Ni at the p-GaN interface. By controlling the diffusion process (through time, temperature, etc.), one may obtain a selected atomic concentration at the interface—for instance, a concentration in the range 1E16 to 5E20 atoms/cm3.

Figure 8B:
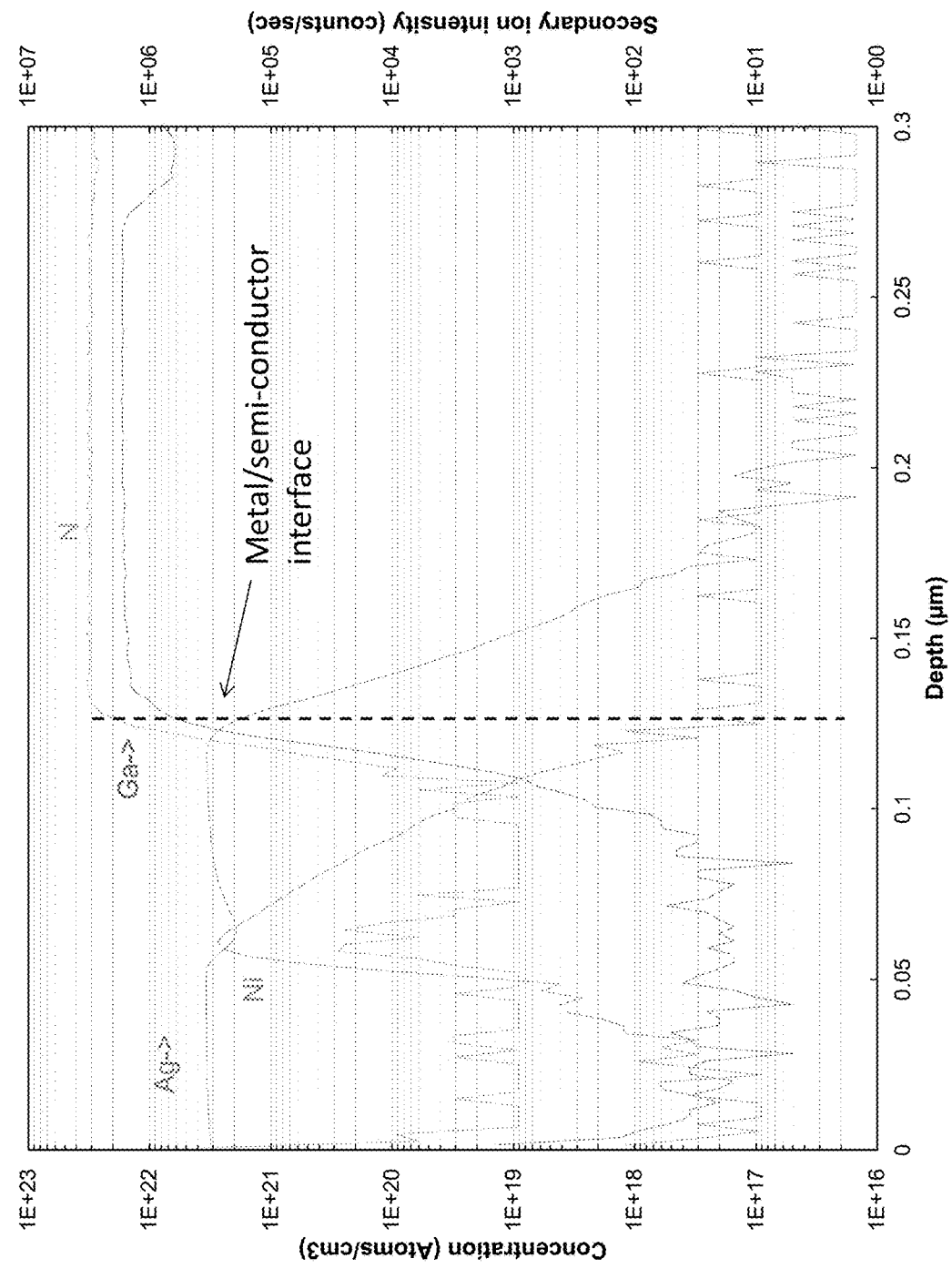
FIGS. 8B and 8C show actual measurements of atomic concentration profiles.
Figure 8C:
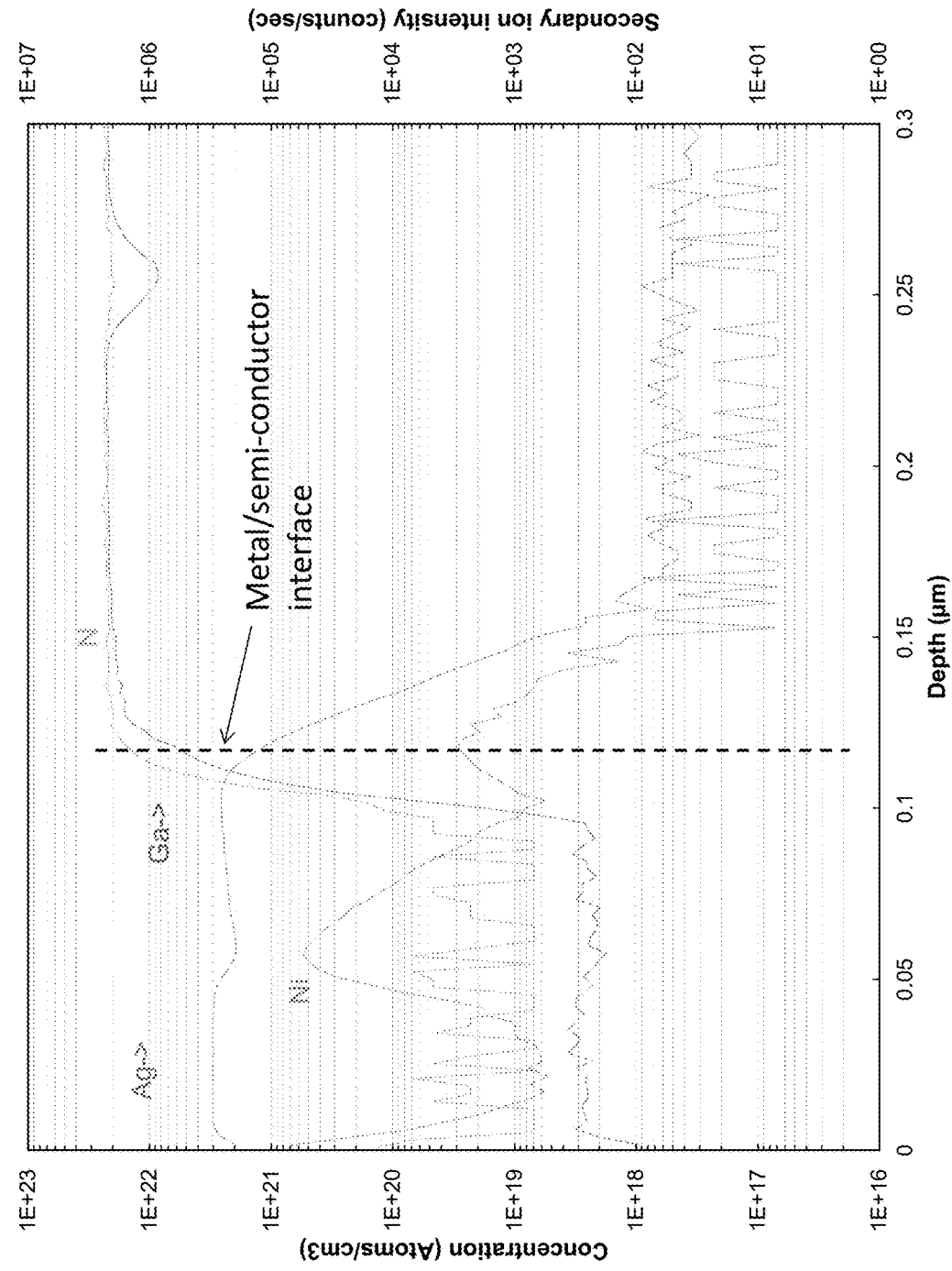

FIGS. 8B and 8C show actual measurements of atomic concentration profiles (obtained by SIMS), which further illustrate the effect of diffusion. Here again, the starting stack, formed on p-GaN, is Ag/Ni/Ag. FIG. 8B shows the initial profile before diffusion. The Ni profile is well-localized (it shoes some tails, which might be due either to SIMS measurement artifacts or to a slight diffusion during the metal deposition step). The Ni concentration at the p-GaN interface is lower than 1E17 cm-3, and is at the detection limit of the SIMS measurement. In this embodiment, the contact is not ohmic. FIG. 8C shows the profile after a diffusion step. Here, the Ni distribution is wider. It has a peak value of 3E19 at the p-GaN interface. After diffusion, the contact is ohmic and the contact resistance is low. The diffusion step has been designed to obtain this desired value. These atomic concentrations may be compared to the concentration of Ag (about 1E22-1E23), which show that the relative Ni concentration remains low at the semiconductor interface. Namely, in the vicinity of the semiconductor interface, the relative atomic concentration of Ni with respect to Ag is in the range 2E-4 to 1E-3. In other cases, a higher relative concentration (such as 1E-2) or a lower concentration Such as (1E-5) may be suitable.

Figure 9:
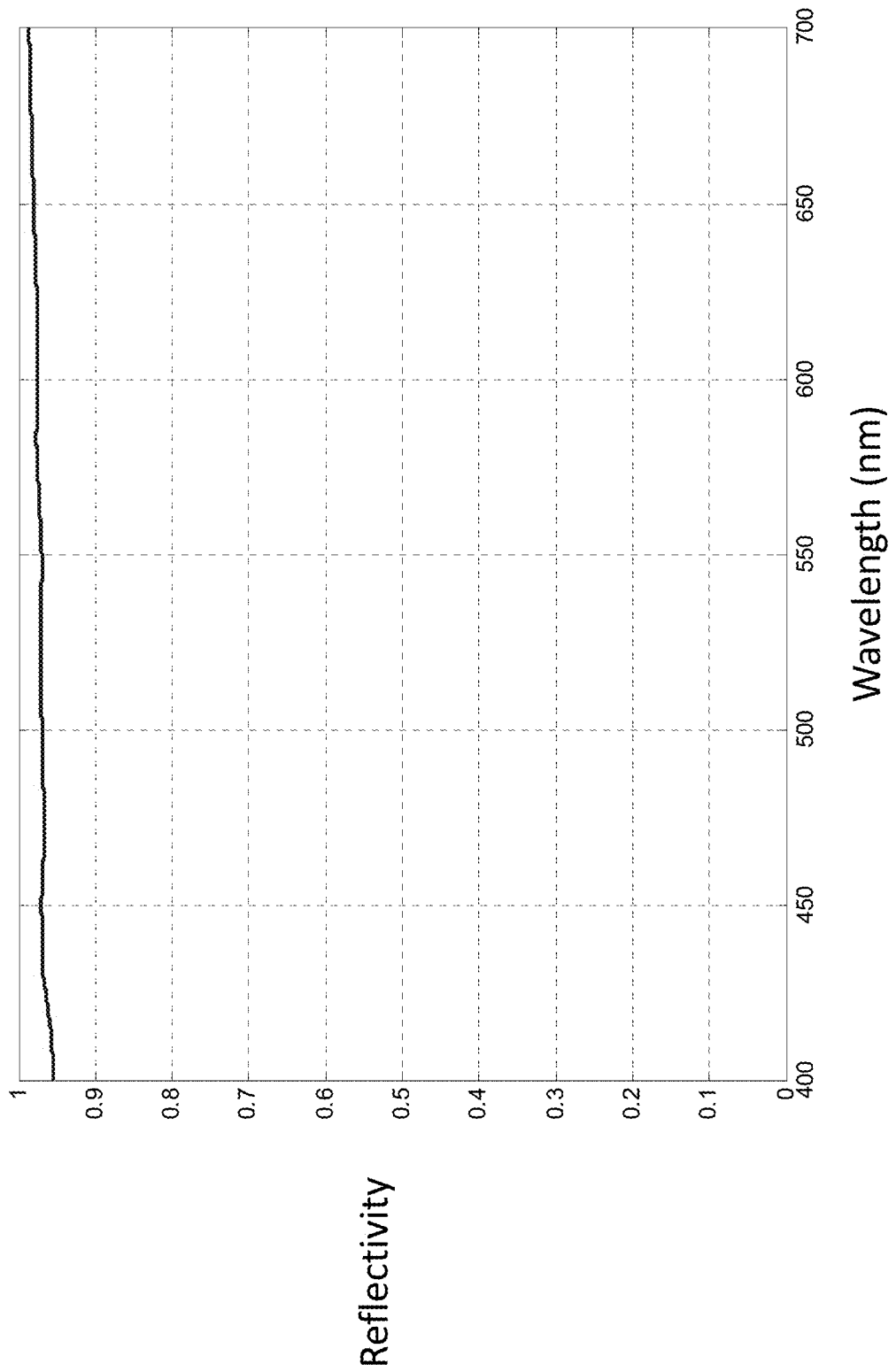
FIG. 9 shows the high reflectivity in the visible range of an Ag-based contact in GaN.

FIG. 9 shows the reflectivity of a GaN/Ag interface for high quality Ag. It can be seen that the reflectivity is above 95% at all wavelengths in the visible range 400 nm-700 nm. Applicants have found that embodiments of the invention were able to maintain the reflectivity of the GaN/Ag interface upon diffusion of a second metal (in some embodiments, within less than 2% or less than 1%).

In some embodiments related to optical devices, the ability to have good (low-resistance) contacts which also have high reflectivity is instrumental in optimizing the overall performance of the device, especially as it pertains to the relative area occupied by the n- and p-contacts. This stands in contrast to conventional devices. For instance, some conventional devices use an Ag-based p-contact with good resistance and very high reflectivity (about 95%) and an Al n-contact which, although it has good resistance, has moderate reflectivity (about 80-85%). In contrast, embodiments employ two Ag-based contacts having both low resistance and high reflectivity (about 95%). In the following Applicants discuss implications for device optimization.

Figure 10A:
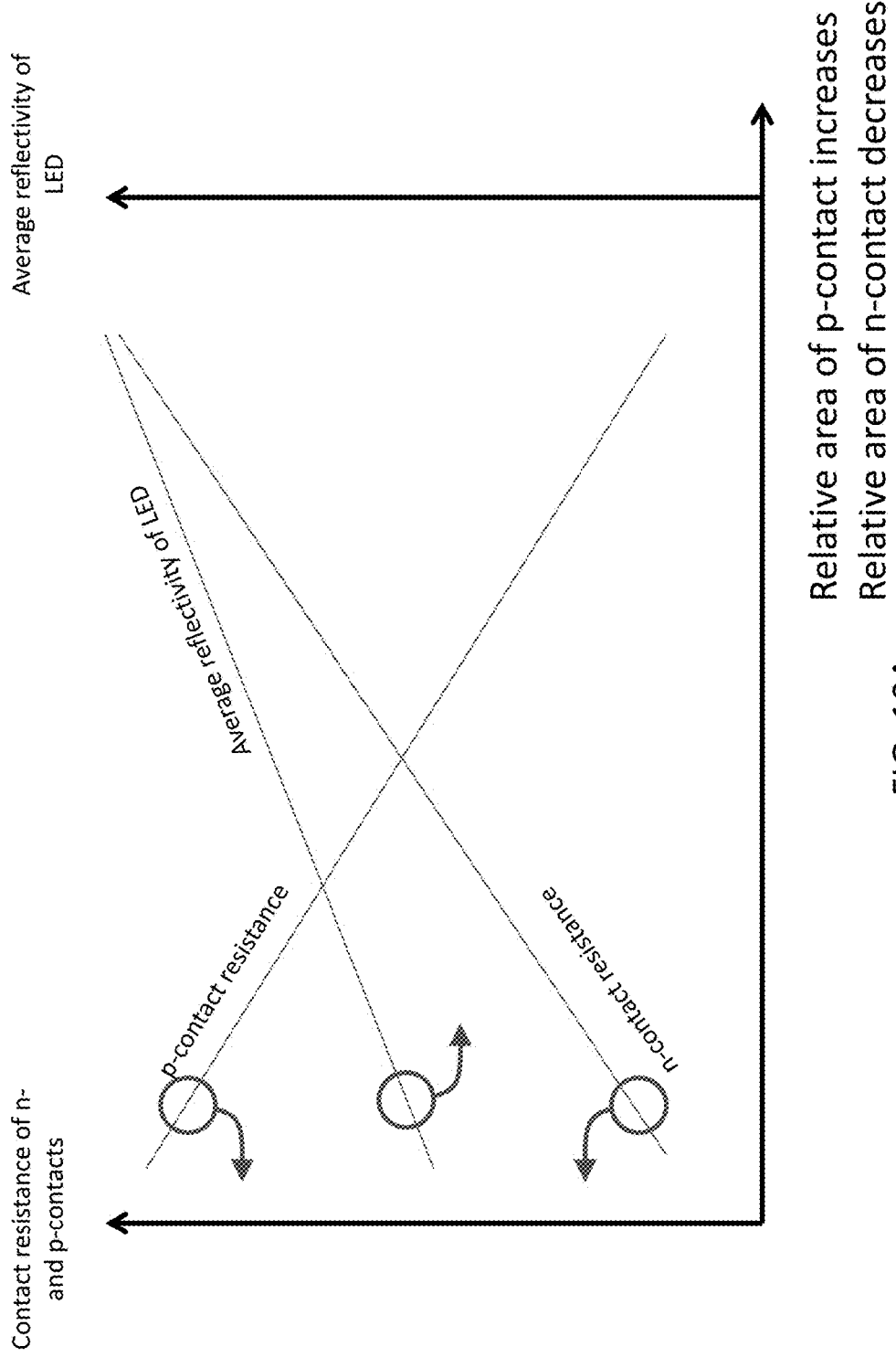
FIG. 10A qualitatively illustrates how various performance metrics vary as the relative area of the p-contact increases.

Typically, there is a fixed footprint in a device and one must decide how to allocate it between p- and n-contacts. FIG. 10A qualitatively illustrates how various performance metrics vary as the relative area of the p-contact increases (and hence, the relative area of the n-contact decreases). In a conventional device, the p-contact resistance decreases and the n-contact resistance decreases (more accurately, each resistance scales with the inverse of the area of a contact). In addition, the average reflectivity of the LED (that is, the area-weighed averaged of the reflectivities of the n- and p-contacts) increases. This is because the n-contact has a lower reflectivity than the p-contact. Therefore, in optimizing a conventional device, one must take into account the trade-off between all these figures of merit (and potentially other figures of merit, such as the effect of p-contact area on current droop).

Figure 10B:
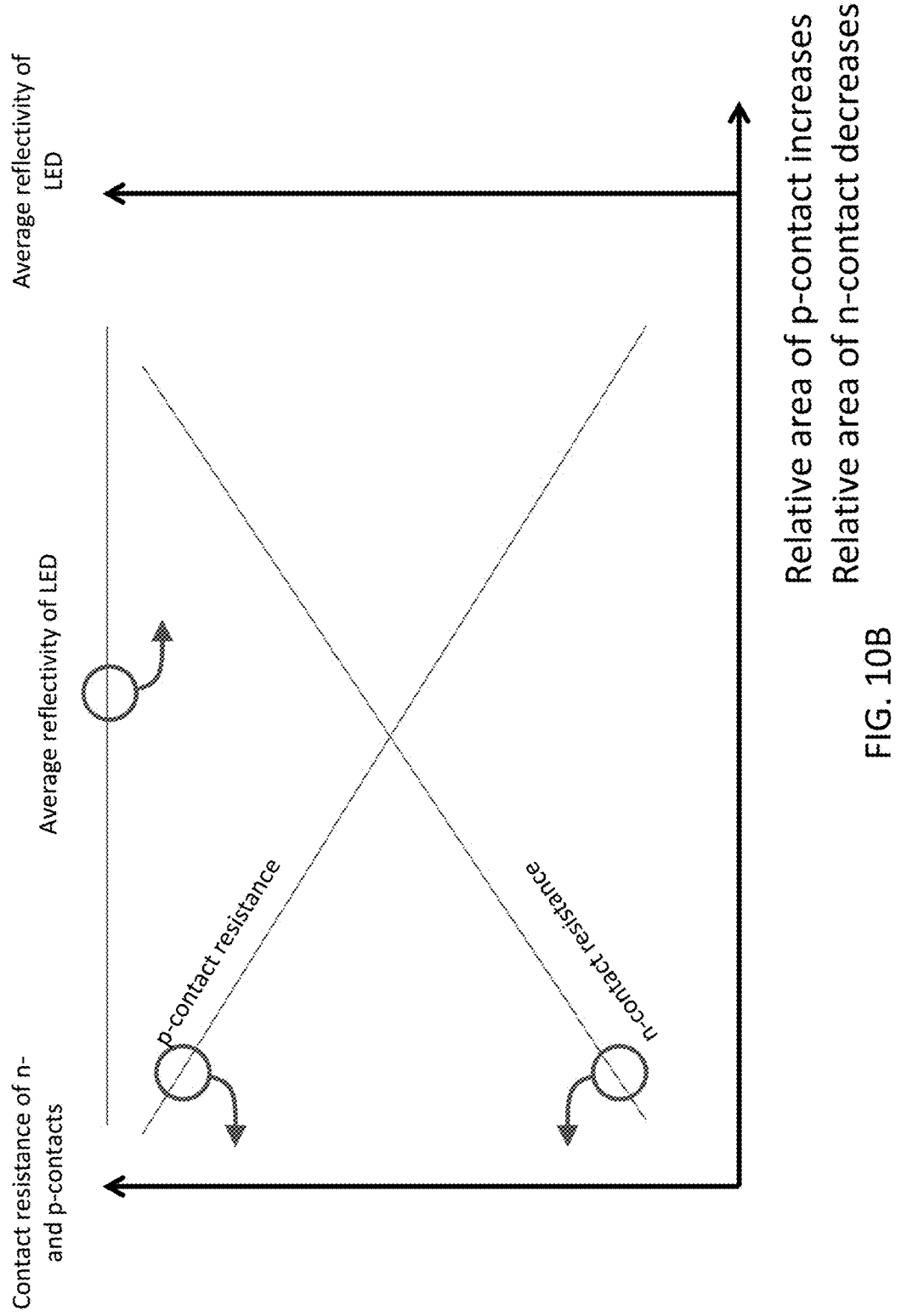
FIG. 10B shows an equivalent plot of an embodiment of the invention.

FIG. 10B shows an equivalent plot in an embodiment of the invention. Here again, the contact resistances inversely scale with their areas, as in FIG. 10A. In contrast, however, the average reflectivity of the LED is constant, because both contacts have the same reflectivity—therefore in terms of reflectivity, it does not matter what fraction of the area is covered by either contact. Thus in embodiments, one is free to optimize the size of the two contacts without having to worry about a trade-off with reflectivity, and can focus on optimization of the contact resistances (and other potential figures of merit, as mentioned above). This leads to a more efficient optimal point, since one of the figures of merit (reflectivity) no longer imposes a constraint.

Accordingly, some embodiments of the invention are optical devices utilizing low-resistance high-reflectivity contacts, as taught above, and whose n- and p-contact areas are optimized as just described. Some embodiments cover methods for forming a device having low-resistance high-reflectivity contacts, and for optimizing the device design according to the approach just described.

Although this optimization aspect was just discussed in the context of optical devices, it can be applied to other embodiments: as previously explained, embodiments have the potential to combine desirable properties of a first and a second metal in a given contact. In devices having more than one contact, several contacts can benefit from this approach. This leads to more optimal device properties, overall.

Example

Figure 2A:
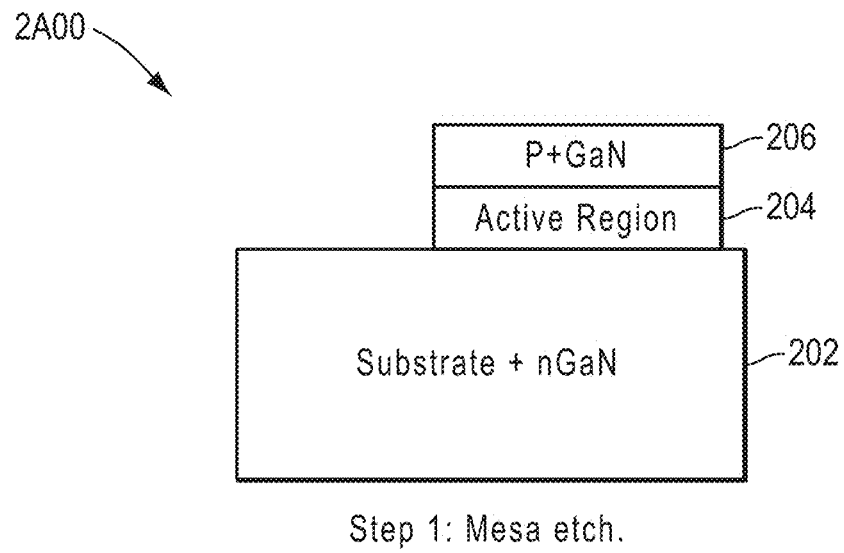
FIG. 2A depicts a side view of a partially-processed LED device in preparation of the device for forming high-reflectivity and low-resistivity contacts on the n-type gallium nitride substrate, according to some embodiments.
Figure 2B:
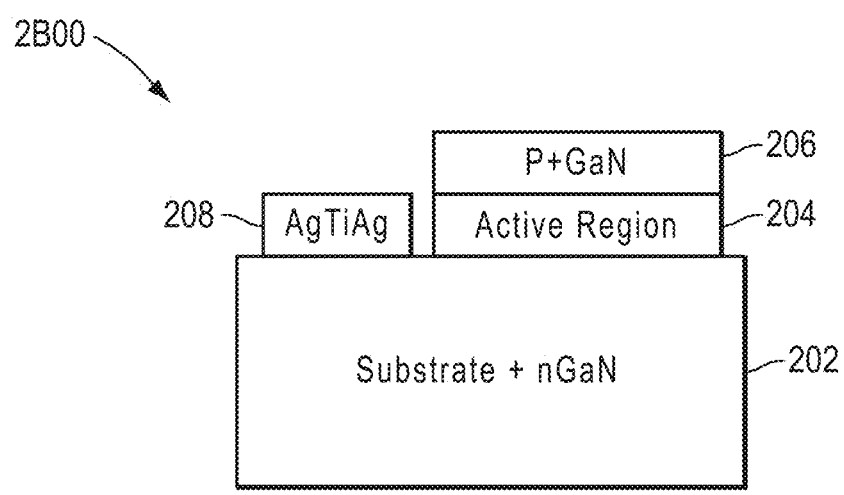
FIG. 2B depicts a side view of a partially-processed LED device and a metal stack contact in preparation of the device for capping before further annealing steps, according to some embodiments.
Figure 2C:
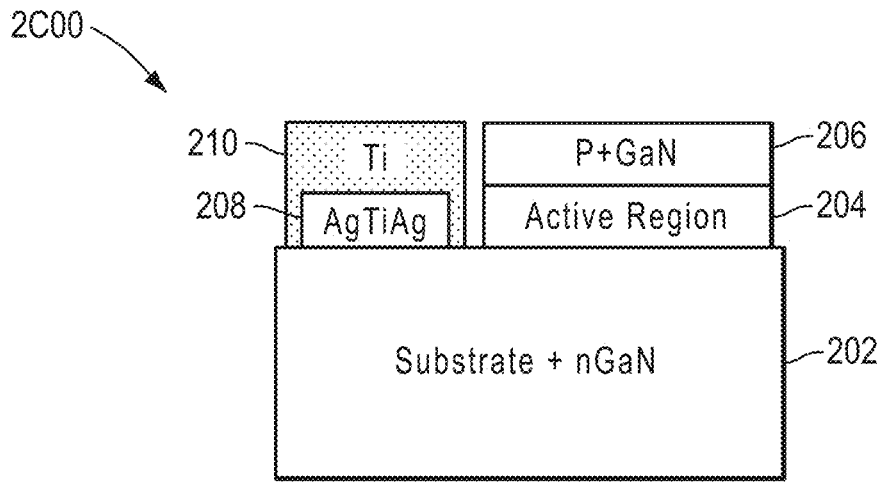
FIG. 2C depicts a side view of a partially-processed LED device and a metal stack contact that has been capped, according to some embodiments.
Figure 6:
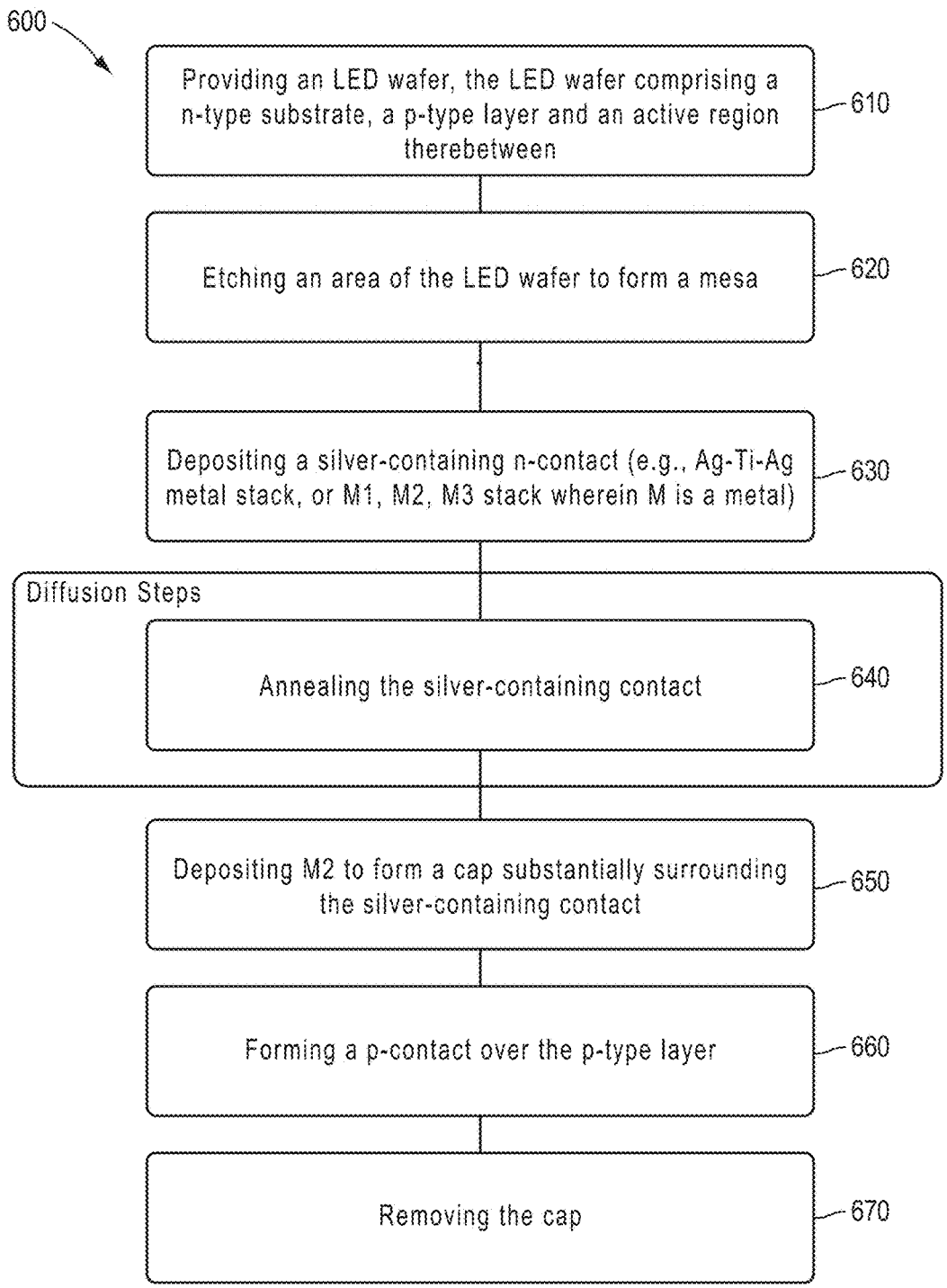
FIG. 6 is a block diagram of a system for forming high-reflectivity and low-resistivity contacts on n-type gallium nitride substrates, according to one embodiment.

Referring to FIGS. 6 and 2A through 2D the preparation of one embodiment of an LED of the present invention is shown. FIG. 6 is a block diagram of a process for forming high-reflectivity and low-resistivity contacts on n-type gallium nitride substrates, and using a cap for subsequent protection of the contact. In step 610, a LED wafer is provided having an n-type substrate, a p-type layer and an active region therebetween. Specifically, referring to FIG. 2A, a side view 2A00 of a partially-processed LED device is shown in preparation of a device for forming high-reflectivity and low-resistivity contacts on n-type gallium nitride. FIG. 2A shows a substrate and n-GaN layer 202, active region 204, p-GaN layer 206. The p-GaN layer may comprise a P++ GaN layer for contact purposes.

In step 620, the LED wafer is etched to form a mesa. Next, in step 630, a silver-containing contact is deposited. For example, referring to FIG. 2B. a side view 2B00 of a partially-processed LED device is shown with a metal stack contact comprising a layer of Ag, a thin layer of Ti, and another layer of Ag. Each Ag layer is 100 nm thick and the Ti layer is 1 nm thick.

Next, in step 640, the LED device is annealed. For example, referring back to FIG. 2B, the Ag—Ti—Ag layers 208 were deposited on n-GaN and diffused in an oxygen-free atmosphere because if oxygen is present during the diffusion step, it binds with Ti and creates an insulating diffused layer. Further, when annealing is performed at a temperature higher than 400° C., the Ti diffuses towards the n-GaN interface, which is the desired effect. A thin layer of Ti does not decrease the reflectivity of Ag significantly as it represents an extremely low density of Ti within the Ag volume. However, if another process step follows during the processing of the LED device (e.g., for formation of the p-contact), in which oxygen is present, that process may be detrimental to the Ag—Ti—Ag contact and will result in high resistivity.

In step 650, a cap is deposited to substantially surround the silver-containing contact. That is, referring to FIG. 2C, after an oxygen-free anneal, the Ag-based n-contact (e.g., Ag—Ti—Ag 208) is capped with a layer 210 that prevents oxygen from penetrating the stack (e.g., a Ti-containing (e.g., Ti or Ag/Ti) cap), which makes the stack resistant to further processing steps such as heating steps where oxygen or other detrimental elements to the contact are present. Specifically, to prevent the penetration of oxygen in subsequent steps, an additional layer is deposited (e.g., deposited either before or after diffusion). If the cap is not added, the resistance of the contact would increase dramatically during the subsequent processing steps where oxygen may be present (such as in the case of a p-contact anneal for instance), as shown in the following FIG. 5A, FIG. 5B and FIG. 5C. With this cap layer, the resistance of the contact will not change after subsequent processing steps. The capping can be done before or after the diffusion step. The cap layer may be removed after the last oxygen containing anneal if needed.

Figure 2D:
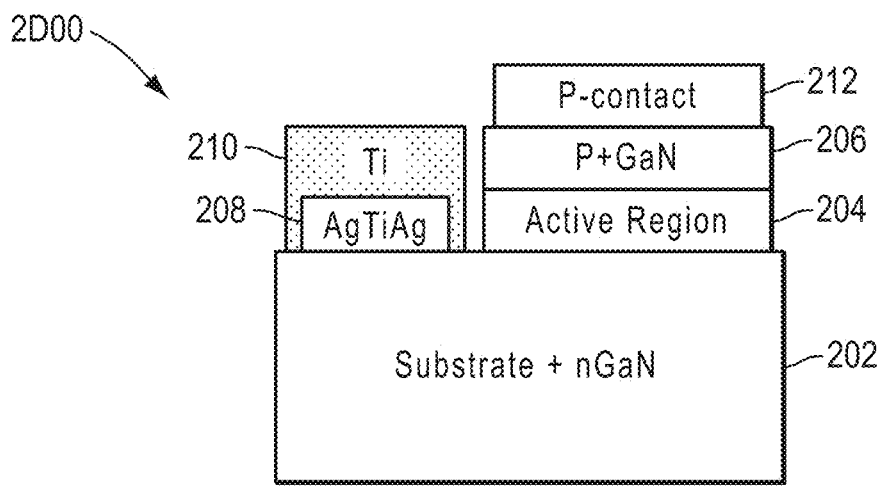
FIG. 2D depicts a side view of a partially-processed LED device after depositing a p-contact while the metal stack n-type contact is protected by the cap, according to some embodiments.

In step 660, a p-type contact is formed over the p-type layer. FIG. 2D depicts a side view 2D00 of a partially-processed LED device after depositing a p-contact 212 while the metal stack n-type contact is protected by the cap. In this embodiment, contacts formed of Ag—Ni—Ag or Ag—Ni were deposited on p-GaN. Each Ag layer is 100 nm thick, and the Ni layer is 1 nm thick. After diffusion, the electrical contacts were excellent and the reflectivity of the stack was preserved. The diffusion of Ni in the p-contact was made in the presence of a controlled amount of oxygen. In this example, Ni diffusion in the presence of oxygen forms a good contact to p-GaN. If the first Ag layer is thick enough or if the Ni is thin enough, the reflectivity of the Ag—Ni—Ag stack is basically the same as Ag and the Ni layer has little effect on the overall reflectivity of the metal stack. It is important to control the oxygen concentration to be high enough to obtain a good p-contact, but not too high for the nearby Ag to start oxidizing, which often dramatically reduces the reflectivity.

In step 670, the cap is removed, for example, to provide for adhesion of additional layers that may be disposed on top of the Ag-based contact. As another example, the cap can be removed it if it is deemed to cause optical losses. However, the cap may also remain.

Figure 3A:
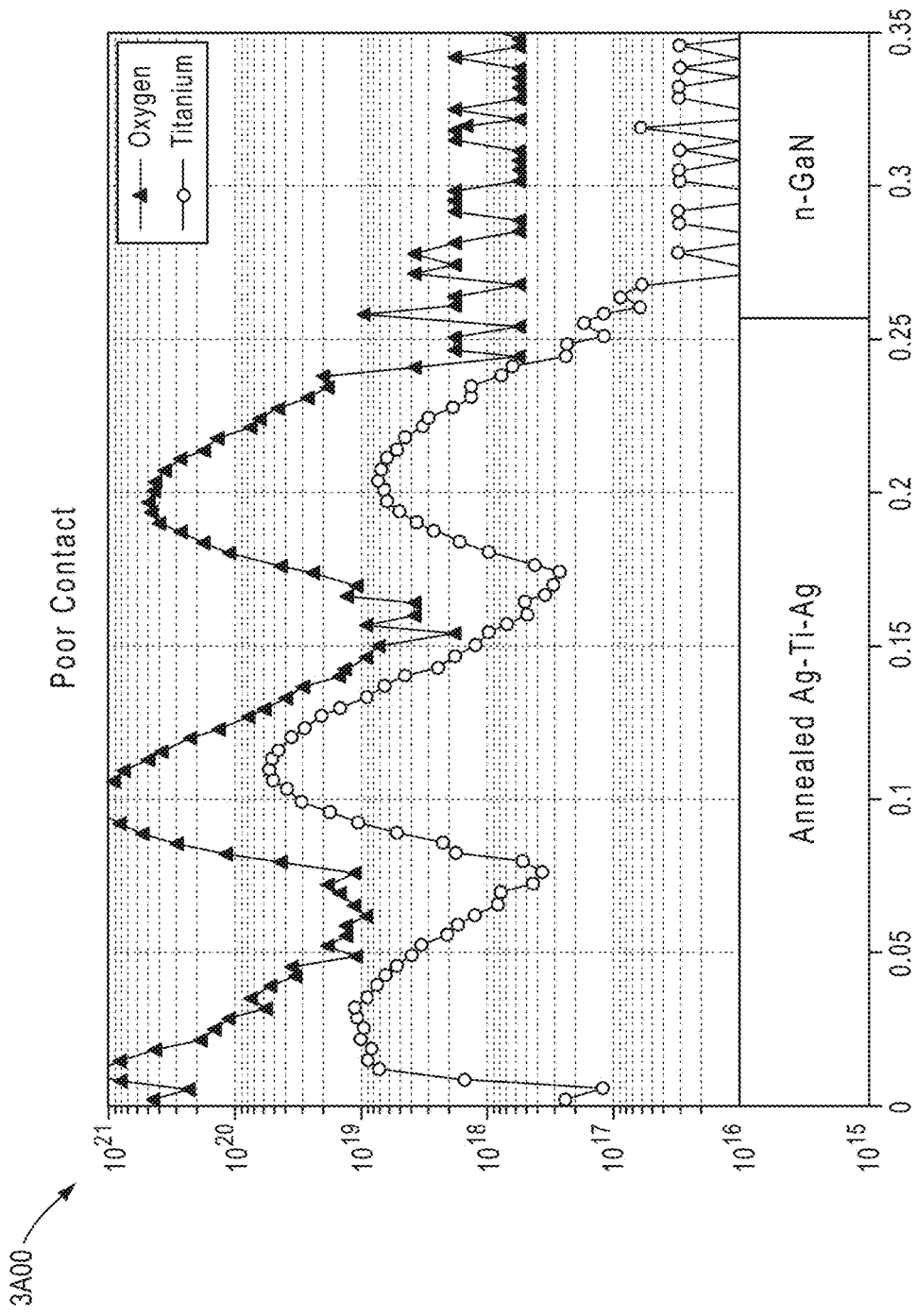
FIG. 3A depicts a SIMS plot of a contact with poor characteristics formed using an oxygen containing annealing furnace.
Figure 3B:
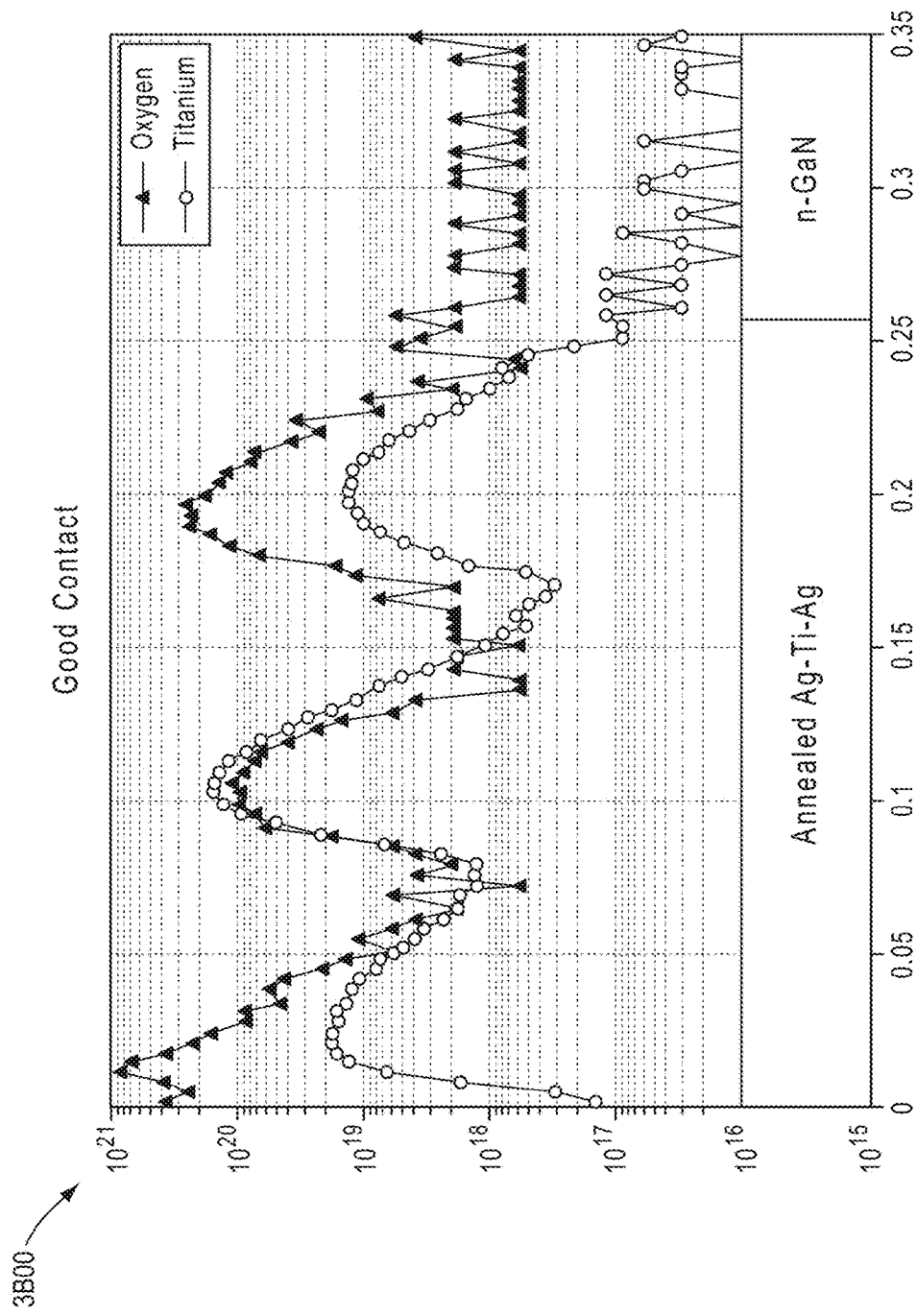
FIG. 3B depicts a SIMS plot of a contact with good characteristics using an annealing furnace with low oxygen.

FIG. 3A is presented to be compared with FIG. 3B. Specifically, the SIMS profile of Ti and oxygen in an annealed Ag—Ti—Ag in an environment with oxygen, results in a high-resistivity contact (see FIG. 3A). By comparison, an annealed Ag—Ti—Ag in an oxygen free environment (see FIG. 3B, below), results in a low resistivity contact. It is also clear that in both embodiments the Ti diffuses and accumulates at the top surface and the n-GaN interface. In FIG. 3A, the oxygen concentration is about two orders of magnitude higher than the Ti concentration. In contrast, In FIG. 3B, the oxygen concentration is only about one order of magnitude higher than the Ti concentration, thanks to the reduced presence of oxygen during the diffusion step.

FIG. 3B depicts a SIMS plot 3B00 showing good contact characteristics of contacts. Good contact characteristics are exhibited by contacts that include a thin Ti layer within an Ag layer, for example, 1000 Å of Ag, 10 Å of Ti, and 1000 Å of Ag. Upon diffusion, this results in an ohmic and low resistivity contact and preserves the high reflectivity when diffused under certain conditions. In particular, the presence of oxygen during the annealing resulted in a high-resistivity contact while the absence of oxygen during the annealing resulted in low-resistivity. The Ag—Ti—Ag film annealed in an oxygen-free environment contained less oxygen which is beneficial for the contact (as shown in FIG. 3A). More specifically, FIG. 3A corresponds to a non-ohmic contact. In other embodiments, a bad contact quality can be characterized by an ohmic contact having a high contact resistance of 1E-1 Ohm·cm2 or higher. In contrast, FIG. 3B corresponds to an ohmic contact with a contact resistance lower than 1E-3 Ohm·cm2.

Figure 4:
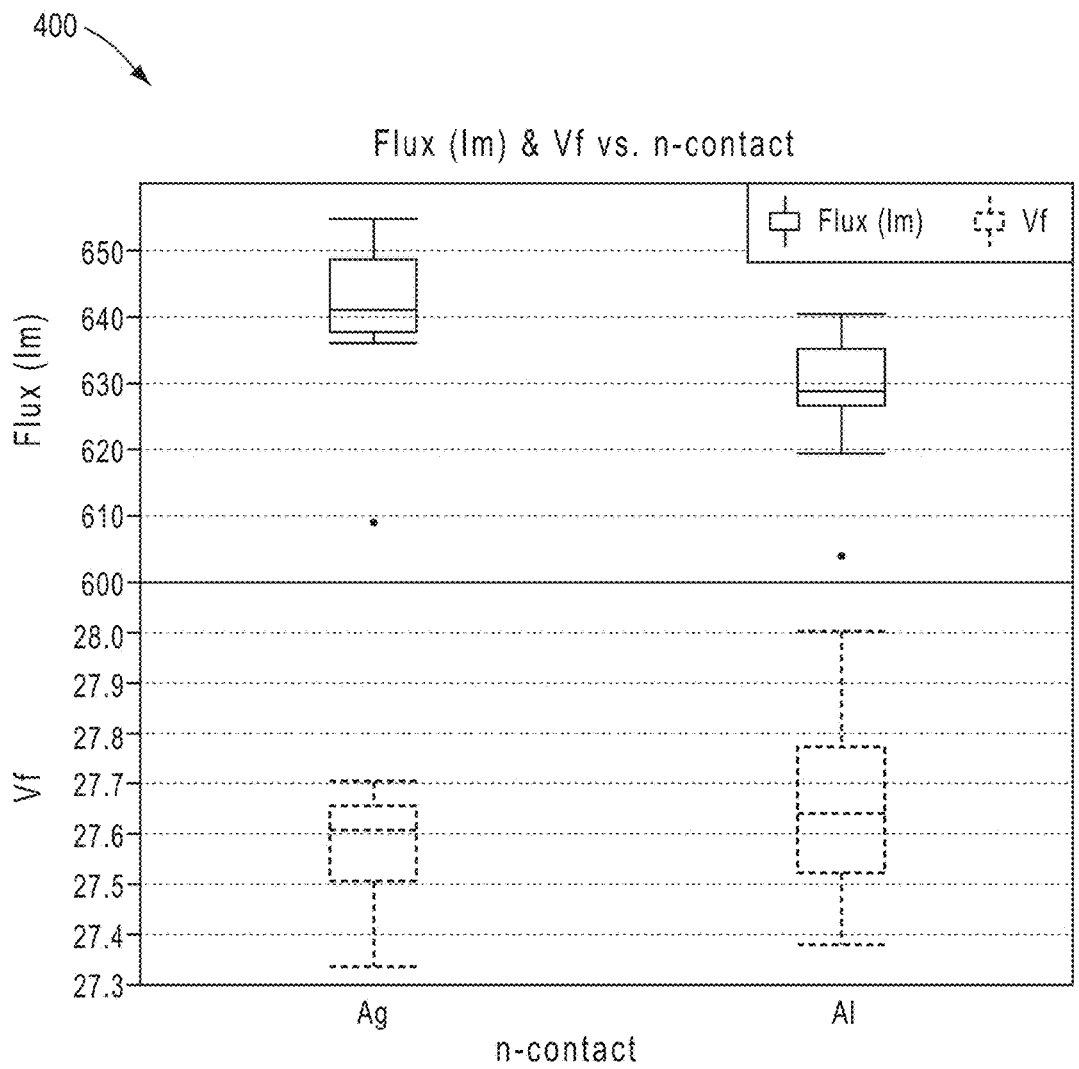
FIG. 4 is a comparison chart showing characteristics of an LED with an aluminum contact as compared with the high-reflectivity and low-resistivity contact on the n-type gallium nitride substrate, according to some embodiments.

FIG. 4 is a comparison chart 400 showing characteristics of an LED with an aluminum-based contact as compared with an LED with a Ag-based contact made according to the disclosed techniques. Specifically, FIG. 4 shows the advantage of using a Ag—Ti—Ag contact scheme compared to Al. The Ag-based contact leads to a more efficient device. More specifically, both metal stacks form ohmic contacts having a similar contact resistance, as evidence by the similar forward voltage Vf in operation. However, the Ag-based contact also shows an increased luminous flux on behalf of its higher reflectivity. Therefore, this figure shows hos embodiments of the invention combine the beneficial electrical properties of Ti (good contact) and the beneficial optical properties of Ag (good reflector). In this embodiment, the Ag-based contact in GaN has a high reflectivity in the visible range, as shown on FIG. 9. The Ag-based contact is characterized by an ohmic contact with a contact resistance of less than 5E-5 Ohm·cm2. Other embodiments have a reflectivity higher than 90% or 95% across the visible range, or in a specific wavelength range, and a contact resistance between 1E-3-1e-7 Ohm·cm2

In some experiments, using the methods described herein, Applicants have achieved GaN-based LED devices having both n-contacts and p-contacts having a reflectivity higher than 95% across the visible range 400-700 nm, and both having a contact resistance lower than 5E-4 Ohm·cm2. Devices for which both contacts have all these desirable properties are not known in the art. This was achieved by using Ag as the first metal in both contacts, and diffusing a suitable second metal as the second metal. Specifically, the second metal may be (Pt, Pd, Ni, NiOx) for p-GaN and may be (Al, Ti) for n-GaN. Other second metals forming an ohmic contact may be suitable.

Figure 5A:
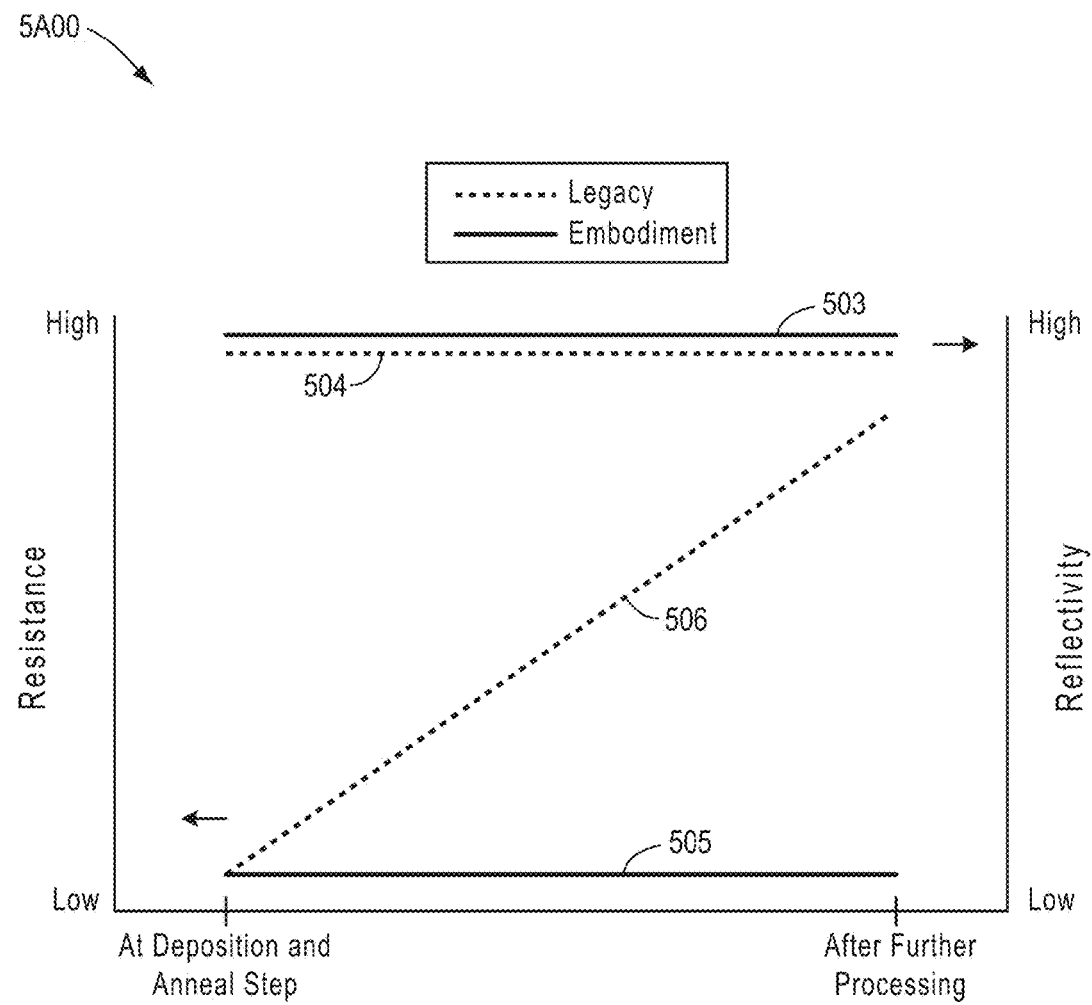
FIG. 5A is a comparison chart showing differences in resistance between devices formed with a cap versus devices formed without a cap.

FIG. 5A is a comparison chart showing differences in resistance between devices formed with a cap versus devices formed without a cap. As shown, a device formed using a conventional process exhibits a conventional process reflectivity (see conventional reflectivity range 504) that is in a high range substantially similar to a device formed using the disclosed techniques (see comparison reflectivity range 505). However a device formed using a conventional process exhibits a dramatic and highly undesirable increase in resistance of the contact (see conventional resistance range 506) caused by degradation of the contact during subsequent processing steps. A device formed using the disclosed techniques (see comparison resistance range 505) exhibits desired resistance characteristics, owing to the protective effect of the cap during subsequent processing steps.

Figure 5B:
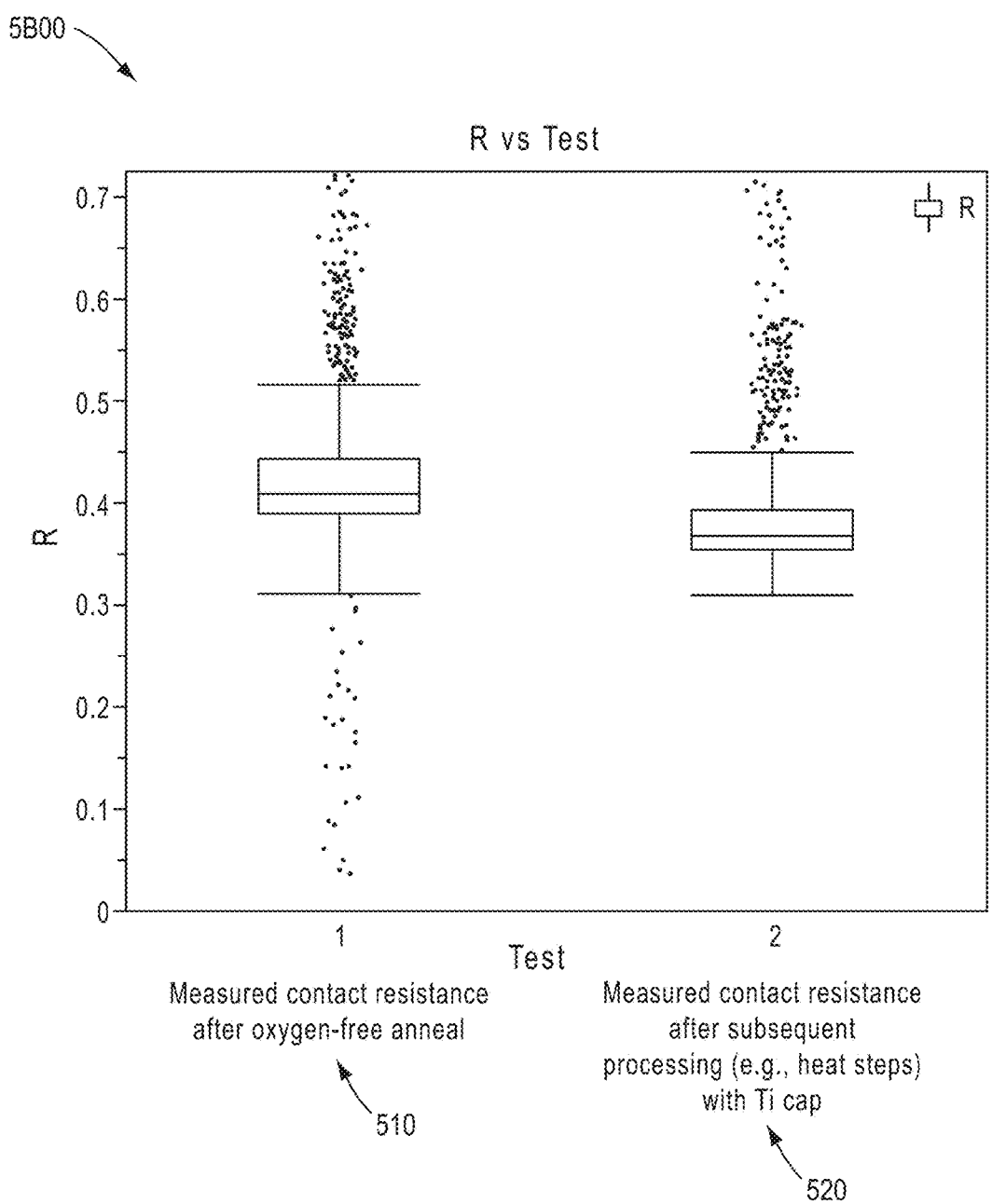
FIG. 5B and FIG. 5C present experimental measurements taken under a controlled experiment with use of a cap (FIG. 5B) and without the use of the cap (FIG. 5C).
Figure 5C:
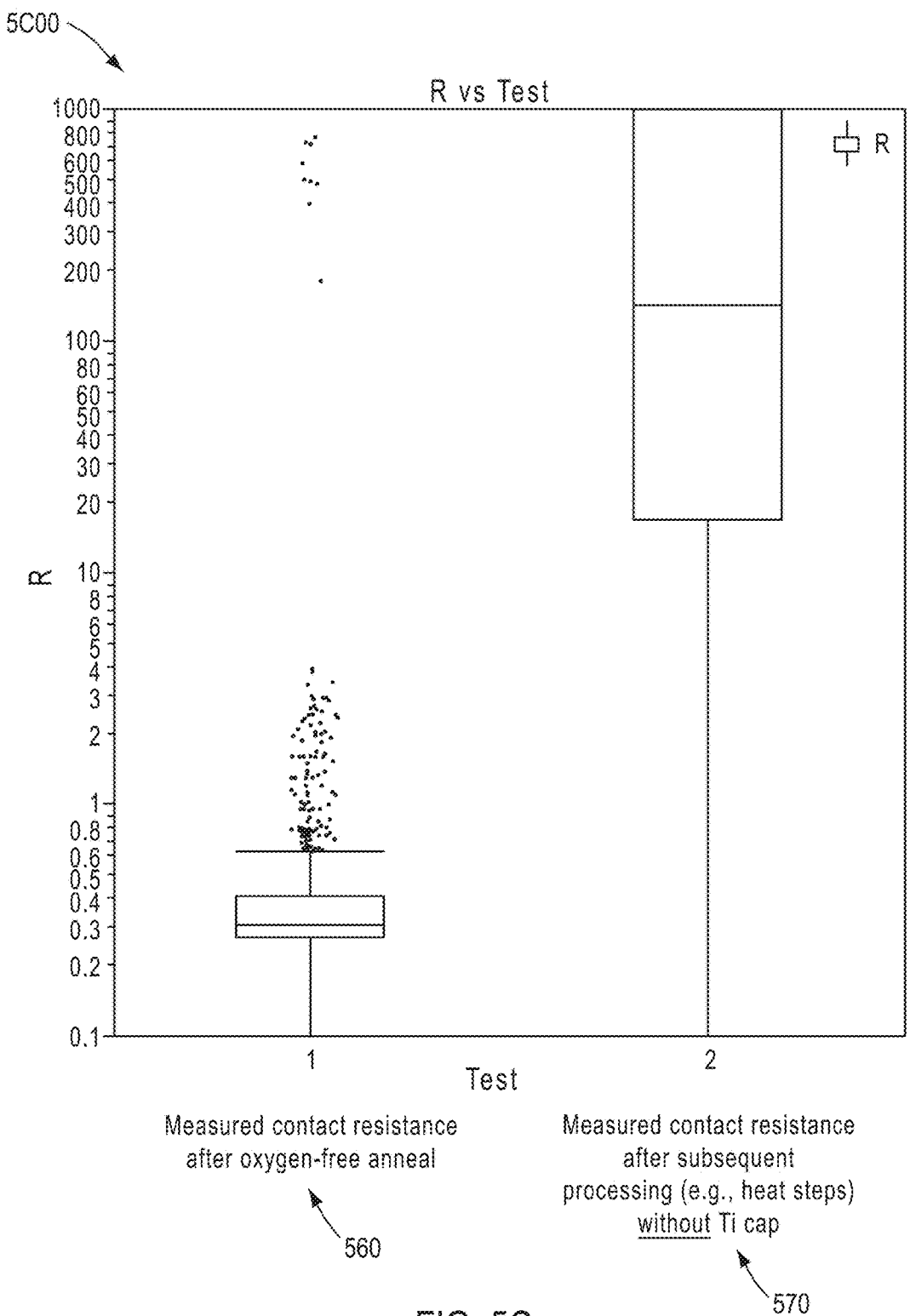

FIG. 5B and FIG. 5C present measurements taken under a controlled experiment with (FIG. 5B) and without (FIG. 5C) the use of the cap. In this embodiment, the cap is a 100 nm-thick Ti layer.

FIG. 5B depicts the contact resistance of a first contact formed using a cap, before and after processing through a processing step where oxygen is present (e.g. a heat step). As shown, the resistance is essentially unchanged between the two steps. This shows the cap prevents oxygen contamination of the contact during subsequent the processing step.

FIG. 5C depicts the contact resistance of a first contact formed without using a cap, before and after processing through a processing step where oxygen is present (e.g. a heat step). As shown, the unwanted effect of dramatically-increased resistance as shown by comparing the two steps. Dramatically-increased resistance is evident by mere inspection.

While this description is made with reference to exemplary embodiments, it will be understood by those skilled in the art that various changes may be made and equivalents may be substituted for elements thereof without departing from the scope. In addition, many modifications may be made to adapt a particular situation or material to the teachings hereof without departing from the essential scope. Also, in the drawings and the description, there have been disclosed exemplary embodiments and, although specific terms may have been employed, they are unless otherwise stated used in a generic and descriptive sense only and not for purposes of limitation, the scope of the claims therefore not being so limited. Moreover, one skilled in the art will appreciate that certain steps of the methods discussed herein may be sequenced in alternative order or steps may be combined. Therefore, it is intended that the appended claims not be limited to the particular embodiment disclosed herein.

What is claimed is:

1. A method of preparing an n-contact in a GaN semiconductor, said method comprising:
   disposing a layer of a first metal on a GaN semiconductor to define a semiconductor interface, said GaN semiconductor being n-doped and having a semiconductor work function, said first metal being in sufficient amount to impart a first property in said layer; and
   after disposing said layer, diffusing a second metal in said layer, said second metal having a metal work function, said second metal having a concentration in said layer of between about 1E16 and 1E20 atoms/cm3 at said semiconductor interface, said concentration being sufficiently low that said second metal does not diminish said first property of said layer by more than 10%, said concentration being sufficiently high and said metal work function being within +/−0.5 eV of said semiconductor work function such that the contact is ohmic.

2. The method of claim 1, wherein said first property is an optical property.

3. The method of claim 2, wherein said first property is reflectivity.

4. The method of claim 3, wherein said reflectivity is not reduced by more than 10%.

5. The method of claim 3, wherein said reflectivity is not reduced by more than 5%.

6. The method of claim 3, wherein said reflectivity is not reduced by more than 1%.

7. The method of claim 1, wherein said first property is adhesion or thermal conductivity.

8. The method of claim 1, wherein diffusing said second metal in said layer comprises depositing a first layer of said first metal on a portion of said GaN semiconductor, depositing a second layer of said second metal on said first layer, and then annealing said GaN semiconductor to cause said second metal to diffuse in said first layer.

9. The method of claim 1, further comprising diffusing a third metal diffused in said layer in a sufficient concentration to impart a third property in said layer without significantly diminishing said first property of said layer.

10. The method of claim 1, further comprising overlaying a second layer on said layer, said second layer comprising said second metal.

11. The method of claim 10, further comprising overlaying a third layer on said second layer, said third layer comprising said first metal.

12. The method of claim 1, further comprising disposing a protective layer above said layer of said first metal prior to said diffusing said second metal.

13. The method of claim 12, wherein said protective layer is a barrier for oxygen.

14. The method of claim 12, further comprising disposing at least one additional metal layer above said layer of said first metal and below said protective layer.

15. The method of claim 1, wherein said first metal is selected from the group consisting of silver, gold, and aluminum, and said second metal is selected from the group consisting of, aluminum and titanium.

16. The method of claim 1, wherein said amount equates to a layer thickness of about 20 nm to about 1000 nm.

17. The method of claim 1, wherein said concentration is between 1E18 and 1E20 atoms/cm3.

18. The method of claim 1, wherein said concentration is an atomic concentration of the second metal at said semiconductor interface, and a ratio of said concentration to an atomic concentration of the first metal at said semiconductor interface is within a range of 1E-7 to 5E-2.

19. The method of claim 1, wherein said second metal has an initial concentration at said semiconductor interface before being diffused, and wherein said concentration is higher than said initial concentration.

20. The method of claim 19, wherein said concentration is higher than said initial concentration by a factor of at least 100.

21. The method of claim 1, wherein ohmic contact has a specific contact resistance of less than 1e-3 Ohm·cm2.

* * * * *